United States Patent [19]

Yamauchi

[11] Patent Number: 5,051,957
[45] Date of Patent: Sep. 24, 1991

[54] SENSE AMPLIFIER CIRCUIT FOR LARGE-CAPACITY SEMICONDUCTOR MEMORY

[75] Inventor: Hiroyuki Yamauchi, Osaka, Japan

[73] Assignee: Matsushita Electric Industrial Co., Ltd., Japan

[21] Appl. No.: 462,538

[22] Filed: Jan. 3, 1990

[51] Int. Cl.$^5$ ............................................. G11C 11/40
[52] U.S. Cl. ................................... 365/190; 365/205; 307/530
[58] Field of Search ................. 365/189.01, 190, 207, 365/205; 307/530

[56] References Cited

U.S. PATENT DOCUMENTS 4,751,682 6/1988 Matsuoka et al. .................. 365/208

OTHER PUBLICATIONS

Dhong et al., "A High Performance Sensing Scheme for CMOS Drams," IBM Technical Publication, vol. 6-5, pp. 83-84.
Okamura et al., "Decoded-Source Sense Amplifier for High-Density DRAMs," Publication of Toshiba Corporation, pp. 103-104.
Kimura et al., "A 65-ns 4-MBit CMOS DRAM with a Twisted Driveline Sense Amplifier," IEEE Journal of Solid State Circuits, vol. SC-22, No. 5, Oct. 1987, pp. 651-656.

Primary Examiner—Terrell W. Fears
Attorney, Agent, or Firm—Lowe, Price, LeBlanc & Becker

[57] ABSTRACT

A sense amplifier circuit for a semiconductor memory includes a flip-flop coupled to a pair of bit lines connected to memory cells, for amplifying a differential read voltage produced between the bit lines, and at least two switches for applying respectively different levels of drive voltage to a common node of the flip-flop. The switches are controlled such as to apply a relatively high value of drive voltage to the common node when a read operation is initiated, to thereby initially provide a high charging current to the bit line capacitance, and thereafter supply a lower value of drive voltage to thereby ensure reliability of the memory cell oxide film.

9 Claims, 16 Drawing Sheets

FIG. 6
(A) WORD LINE SIGNAL
(B) CONTROL SIGNAL SC1 
(C) CONTROL SIGNAL SC2 
(D) BIT LINE 2 VOLTAGES 

SENSE AMPLIFIER CIRCUIT FOR LARGE-CAPACITY SEMICONDUCTOR MEMORY

BACKGROUND OF THE INVENTION

1. Field of Applicable Technology

The present invention relates to a circuit of a sense amplifier for amplifying a signal voltage produced by reading the contents of a memory cell of a semiconductor memory. In particular, the invention relates to an improved sense amplifier circuit whereby a high speed of read-out operation can be achieved while limiting the maximum bit line voltage such as to ensure reliability of a memory cell oxide film.

2. Prior Art Technology

FIG. 1 is a circuit diagram of an example of a prior art sense amplifier circuit, while FIG. 2 shows waveforms appearing in the circuit of FIG. 2. This will be referred to as a P-type sense amplifier circuit, since the circuit is based on P-channel MOS FETs (field effect transistors). Numeral 2 denotes a pair of bit lines of a semiconductor memory, with each of the bit lines being coupled to a row of memory cells 8. A pair of P-channel MOS transistor have the gate and drain electrodes thereof mutually cross-coupled to form a flip-flop 1, with the drain electrodes being respectively connected to the bit line pair 2 as shown. The source electrodes of these transistors are mutually connected, with that junction being referred to in the following as a common node. The common node of the P-type flip-flop 1 is connected to the drain electrode of a P-channel MOS transistor 3 which functions as a switching element, and whose source electrode is coupled to receive an internal supply voltage $V_{cc}'$. An external supply voltage $V_{cc}$, e.g. provided from a main power supply unit and having a value of +5.0 V for example, is supplied to the internal voltage generating circuit 4. The internal voltage generating circuit 4 serves to generate the internal supply voltage $V_{cc}'$, which has a fixed value that can be for example in the range +3 to +4 V, and is supplied via a line 6 to the switching transistor 3.

The internal voltage generating circuit 4 is used to produce an internal supply voltage which is of smaller magnitude than the system power supply voltage in order to limit the voltage level that is supplied by the switching transistor 3 to the common node of the P-type flip-flop 1. This is done in order to ensure the reliability of the oxide film of the memory cells 8 of the semiconductor memory.

An example of a circuit of the internal voltage generating circuit 4 is shown within the broken-line rectangle in FIG. 1.

The operation of this circuit will be described referring to the waveform diagrams of FIG. 2, in which waveform (A) is that of a word line 7 of the semiconductor memory, (B) is that of a gate control signal that is applied to the gate electrode of the switching transistor 3, and (C) is the waveform of a differential voltage that appears between the bit line pair 2. Firstly, when a memory cell 8 of one of the bit lines 2 is selected, by raising the word line potential from a low to a high level as shown, then after a short interval has elapsed, the gate potential of the switching transistor 3 is set from a high to a low level, to thereby turn the switching transistor 3 to the conducting (ON) state. The P-type flip-flop 1 is thereby activated, and if an output voltage is generated from the selected memory cell (e.g. due to a "1" state bit being stored therein) then a differential voltage ΔV will be produced between the two bit lines 2. That is, the respective voltages of the two bit lines 2, designated as $V_a$, $V_b$ in waveform (C), will begin to mutually differ. The P-type flip-flop 1 is thereby triggered, causing the differential voltage to be amplified, as shown in FIG. 2(C).

FIG. 3 shows an example of a prior art N-type sense amplifier. This is basically similar to the P-type sense amplifier described above, but employs N-channel MOS transistor. An N-channel MOS transistor 30 functions as a switching element, for transferring a supply voltage $V_{ss}$ (which in this case is ground potential) to the common node of a N-type flip-flop 10. An internal voltage generating circuit 40 produces a back-bias voltage $V_{bb}'$ which is used to set the substrate potential of each of the N-channel MOS transistor, i.e. to apply a bias voltage which is negative with respect to $V_{ss}$.

A typical circuit configuration for the internal voltage generating circuit 40 is shown within the broken-line rectangle.

The operation of this circuit is illustrated by the waveforms (A), (B) and (C) of FIG. 4. In this case, shortly after a memory cell has been selected, by the corresponding word line going from the low to the high level, the switching control signal (i.e. gate control voltage of the switching transistor 30) is set from the low to the high level, to thereby set the switching transistor 30 in the conducting state. The N-type flip-flop 10 is thereby activated, and if the selected memory cell generates an output voltage, the resultant voltage difference between the corresponding bit line pair 2 will trigger the N-type flip-flop 10. Thus, the differential voltage V is amplified and thereby increases as shown in waveform (C), thereby triggering the N-type flip-flop 10, and so amplifying the differential voltage between the bit line pair 2.

With each of the above prior art sense amplifier circuits, the delay time which elapses between the instant at which memory cell selection by the word line signal begins and the point at which the corresponding bit line pair differential voltage increases to a predetermined minimum value, will basically depend upon the level of current which can be supplied to charge or discharge the bit line capacitance. In the case of a very large-capacity semiconductor memory, e.g. a 4 MB or 8 MB dymanic RAM memory for example, each bit line has a substantial amount of capacitance. The maximum level of current that can be supplied by a MOS FET when operating in the saturated state can be increased either by reducing the threshold voltage Vt of the FET, or increasing the supply voltage applied to the source electrode. However for reasons such as minimizing the level of standby current of the sense amplifier, it is not practical to lower the threshold voltage of the transistors used in the sense amplifier. As a result, with a prior art sense amplifier which utilizes a reduced level of supply voltage in order to increase the semiconductor memory reliability as described above, it has not been possible to achieve satisfactory speed of sense amplifier operation, i.e. the above-mentioned delay time is excessively long.

The current $I_{bit}$ that can be supplied to charge or discharge the capacitance of a bit line via a saturated MOS FET is given as follows:

$$I_{bit} = \frac{1}{2} \frac{W}{L} \mu\, C_{ox}(V_{bit} - V_s - V_{th})^2$$

In the above equation, W denotes the length of the gate electrode of a transistor of the sense amplifier, L denotes the length of the gate electrode, denotes the mobility within a transistor, $C_{ox}$ denotes the capacitance of the gate oxide layer of a transistor, $V_{bit}$ denotes the potential of a bit line which is coupled to the gate of that transistor, and Vs denotes the potential of the common node.

It can thus be understood that it has not been possible in the prior art (in the case of a large-capacity semiconductor memory in which a sense amplifier is operated at a level of supply voltage which will ensure high reliability of memory cells) to achieve a sufficient reduction in the delay time which is required for an output voltage from a memory cell, appearing on a bit line, to be amplified as a bit line differential voltage to a predetermined minimum level. It has therefore been difficult to achieve a sufficiently high speed of memory operation.

SUMMARY OF THE INVENTION

It is an objective of the present invention to overcome the disadvantages of the prior art described above, by providing a sense amplifier for a semiconductor memory whereby the aforementioned delay time is substantially reduced by comparison with the prior art.

The objective is achieved by successively applying respectively different values of supply voltage to switching elements which drive a common node of a sense amplifier, such as the common node of a sense amplifier flip-flop as described hereinabove. During this successive application of supply voltages, a relatively high amplitude of supply voltage is applied for a specific time interval, which is limited in duration such that a resultant increase in potential of a bit line that is driven by the sense amplifier will not exceed a predetermined limit. Thereafter, a supply voltage that is no greater than that predetermined limit is applied via a switching element to the common node. In this way it is ensured that a high level of current is supplied to charge the capacitance of a bit line that is coupled to the sense amplifier, for thereby amplifying a sense voltage that is generated on the bit line by a memory cell. A substantially increased rate of amplification of the bit line voltage is thereby achieved, while limiting the level of voltage that can develop on each bit line, to thereby ensure high reliability of the memory cells that are connected thereto.

More specifically, a sense amplifier according to the present invention includes a pair of transistors respectively coupled to a pair of bit lines for amplifying a differential voltage appearing between the bit lines, the transistors being mutually coupled at a common node, and comprises:

at least a first switching element coupled between a first DC supply voltage and the common node, and a second switching element coupled between a second DC supply voltage and the common node, the first DC voltage having a greater absolute magnitude than the second DC voltage; and means for generating first and second switching control signals for respectively controlling the first and second switching elements subsequent to initiation of a read operation of the semiconductor memory, to successively apply the first and second DC voltages to the common node.

BRIEF DESCRIPTION OF THE DRAWINGS

FIG. 6 is a waveform diagram for describing the operation of the circuit of FIG. 5;

DESCRIPTION OF PREFERRED EMBODIMENTS

Figure 1:
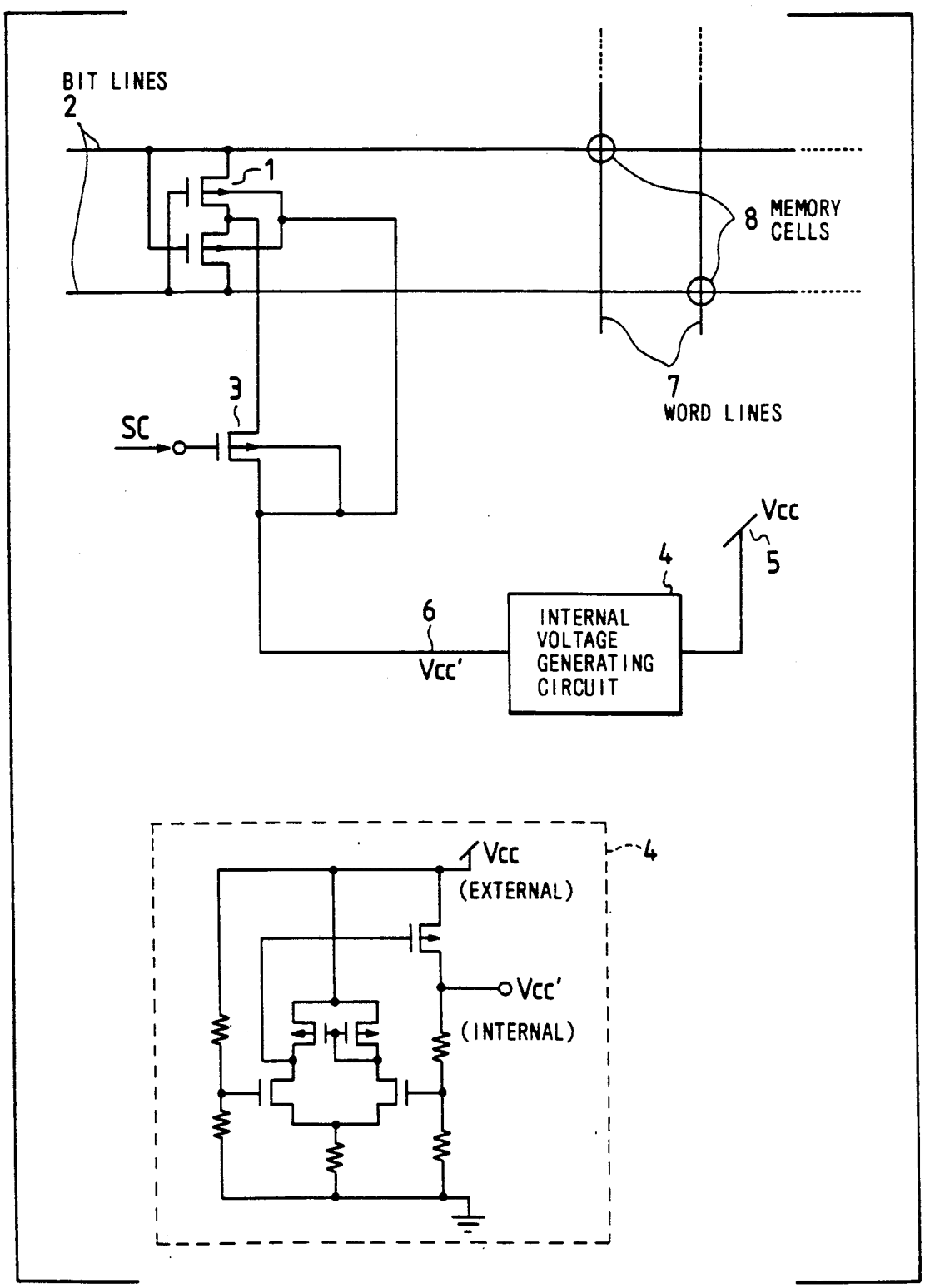
FIG. 1 is a circuit diagram of an example of a sense amplifier formed of P-channel MOS transistor.
Figure 2:
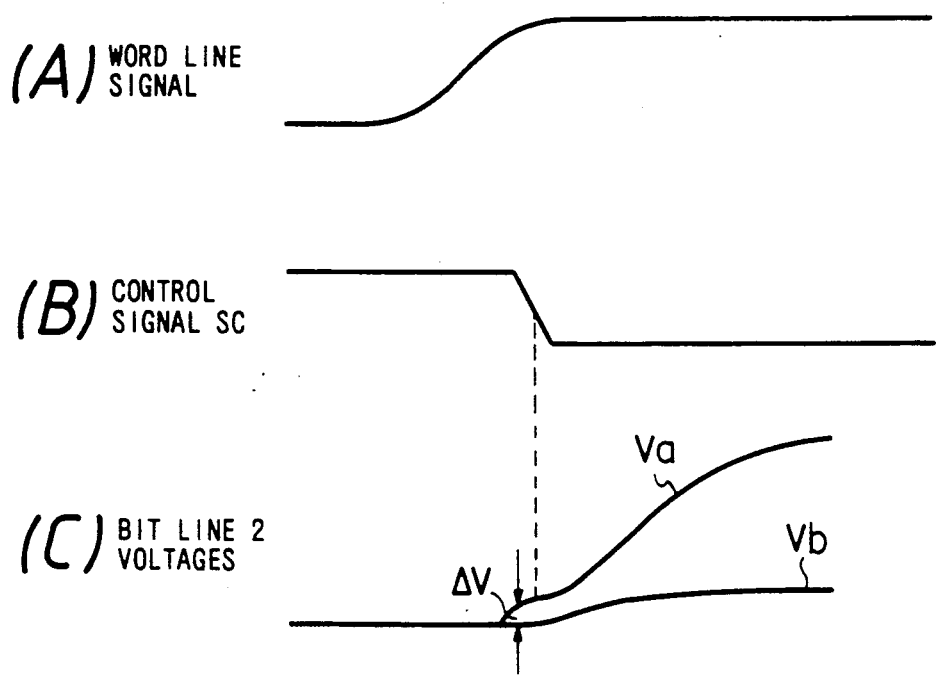
FIG. 2 is a waveform diagram for describing the operation of the circuit of FIG. 1.
Figure 5:
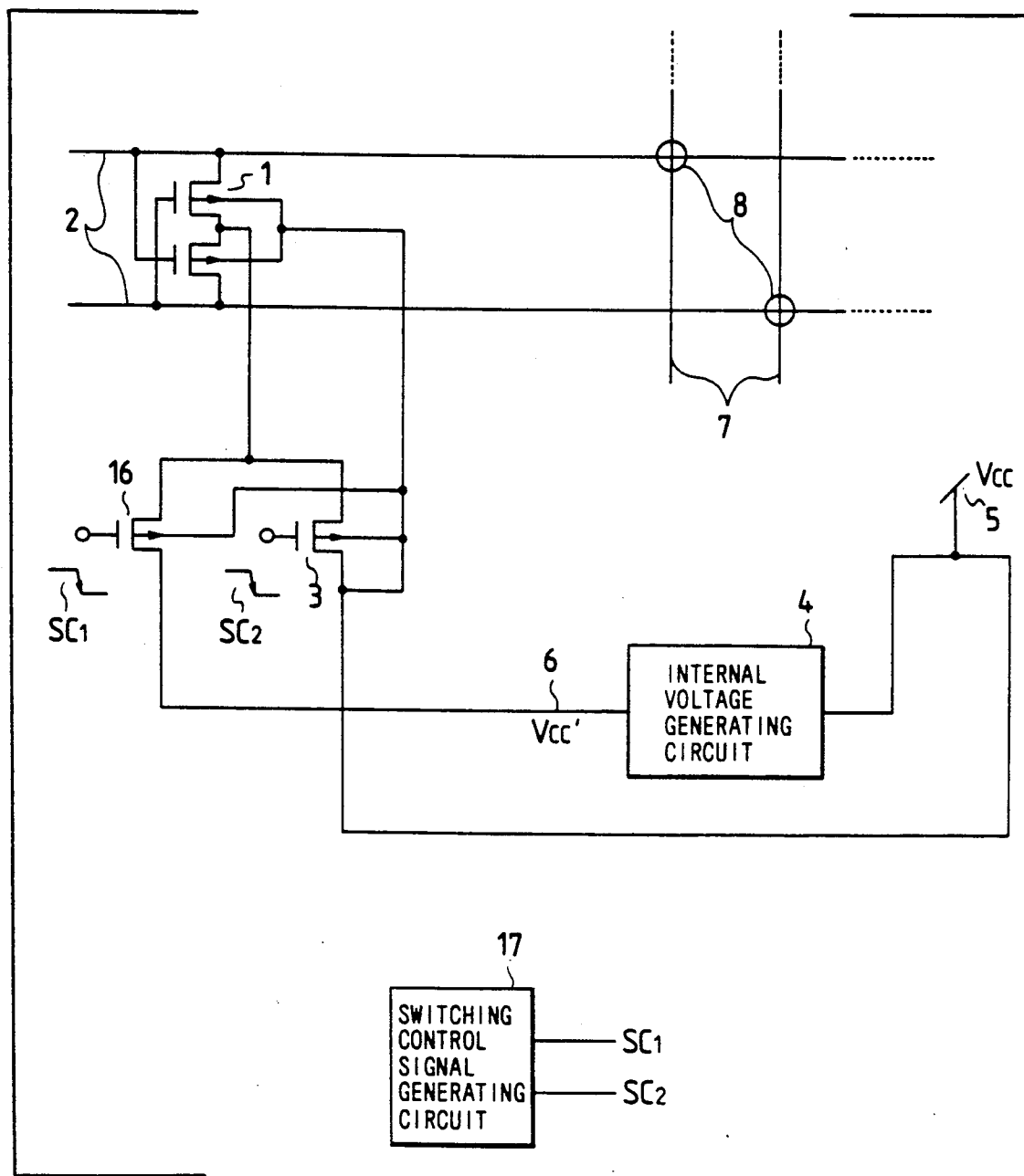
FIG. 5 is a circuit diagram of a first embodiment of a sense amplifier according to the present invention, formed of P-channel MOS transistor.

FIG. 5 is a circuit diagram of a first embodiment of a sense amplifier according to the present invention. This is based on P-channel MOS transistor, as for the prior art example of FIG. 1, with a P-type flip-flop 1 being formed of a pair of transistors having a common source node (referred to in the following simply as a common node) and with each of a pair of bit lines 2 being connected to the drain of a corresponding one of these transistors and to the gate of the other one of the flip-flop transistors. It will be assumed in the following description of each of the embodiments that the potential of each bit line is normally maintained at a value which is intermediate between the $V_{cc}$ and $V_{ss}$ supply voltage levels, e.g. at approximately +1.5 V to +2 V, for the case of +5 V and 0 V supply voltages. The common node is connected to the drain electrodes of each of a P-channel MOS transistor 16, functioning as a first switching element, and a P-channel MOS transistor 3 which functions as a second switching element. The source electrode of the switching transistor 16 is coupled to receive an internal supply voltage $V_{cc}'$ (e.g. +3 V) that is produced from a internal voltage generating circuit 4, while an external supply voltage that is greater (i.e. more positive) than the internal supply voltage $V_{cc}$ (e.g. +5 V) is applied to the source electrode of the switching transistor 3. A switching control signal generating circuit 17 produces a switching control signal $SC_1$ that is applied to the gate electrode of the switching transistor 16 and a switching control signal $SC_2$ that is applied to the gate electrode of the switching transistor 3. The switching control signal generating circuit 17 forms part of a memory controller which generates various control signals for the operation of the semiconductor memory. The substrate potential of each of the P-channel MOS transistor is fixed at the external supply voltage $V_{cc}$ level, thereby ensuring that a forward bias condition between the source and drain of any transistor is prevented, thereby eliminating any problems of leakage current.

The operation of the embodiment will be described referring to the waveform diagrams of FIG. 6. When a word line 7 is selected, by raising the potential thereof from a low to a high level as shown in waveform (A), then shortly thereafter, the switching control signal $SC_1$ is set from the high to the low level, as shown by waveform (B). The switching transistor 16 is thereby set in the ON state, to thereby activate the P-type flip-flop 1. If an output voltage is produced from a memory cell of the bit line pair 2 as a result of the word line selection voltage, then the respective potentials Va, Vb of the bit line pair 2 will begin to mutually differ, to produce a differential voltage $\Delta V$. As a result, the P-type flip-flop 1 is triggered, to thereby amplify the value of differential voltage $\Delta V$. In this condition, the relatively low value of supply voltage $V_{cc}'$ is being applied through the switching transistor 16 to the common node of the P-type flip-flop 1. After a fixed interval has elapsed, the switching control signal $SC_1$ is returned to the high level, thereby setting the switching transistor 16 in the non-conducting state, and at the same time the switching control signal $SC_2$ is set from the high to the low potential level, to thereby turn ON the switching transistor 3, and thereby apply the high-amplitude supply voltage $V_{cc}$ to the common node of the P-type flip-flop 1. In this condition, a high level of current is supplied through the switching transistor 3 and the P-type flip-flop 1 to the bit line on which the read voltage was produced from a memory cell. As a result, there is a rapid amplification of the differential voltage $\Delta V$, as shown in waveform (D). After a short time interval has elapsed, determined such that the voltage of a bit line will not exceed the value $V_{cc}'$, the switching control signal $SC_2$ is returned from the low to the high level, and the switching control signal $SC_1$ is set from the high to the low level. In this condition, the reduced-amplitude supply voltage $V_{cc}'$ is applied via the switching transistor 3 to the common node of the P-type flip-flop 1.

It can thus be understood that this embodiment enables a substantially increased rate of amplification of a bit line differential voltage that is produced by readout of a memory cell, by comparison with the prior art. That is to say, the time taken for the differential voltage between a bit line pair to attain a predetermined minimum value (e.g. to indicate that a "1" state bit has been read) can be significantly reduced by comparison with the prior art example of FIG. 1, while it can be ensured that only a limited maximum level of voltage will appear on any bit line, thus ensuring high reliability of the memory cells of the semiconductor memory.

Figure 7:
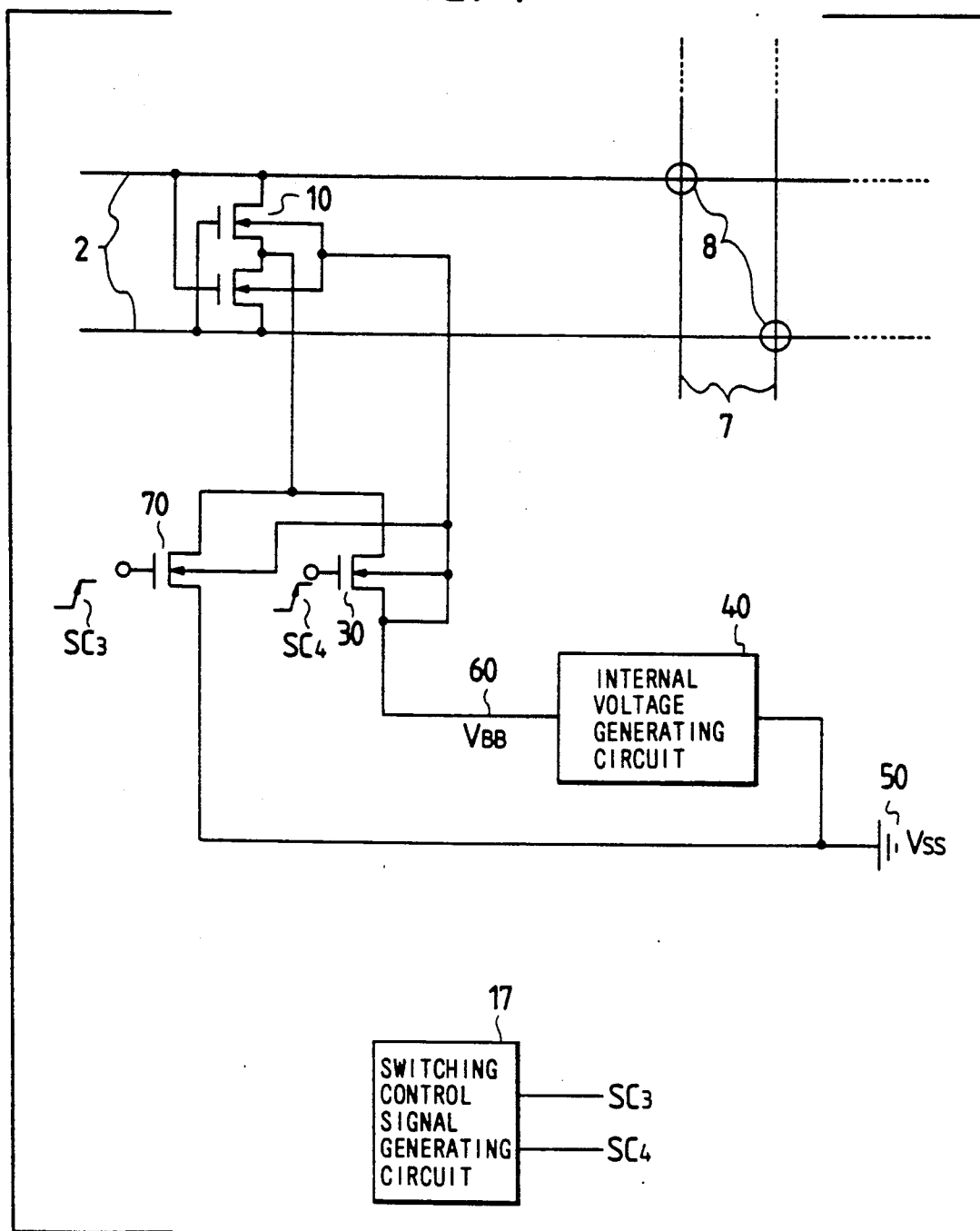
FIG. 7 is a circuit diagram of a second embodiment of a sense amplifier according to the present invention, formed of N-channel MOS transistor.

FIG. 7 is a circuit diagram of a second embodiment of a sense amplifier according to the present invention, whose operating principles are similar to those of the preceding embodiment but which utilizes N-channel MOS transistor. That is to say, a N-type flip-flop 10 is formed of a pair of N-channel MOS transistor having a common source node, which are coupled to a bit line pair 2 for amplifying any read voltage generated thereon from a memory cell. The common node is connected via a N-channel MOS transistor 70 functioning as a first switching element to a supply voltage $V_{ss}$, which in this embodiment constitutes ground potential, and is connected via a N-channel MOS transistor 30 functioning as a second switching element to a back bias voltage $V_{bb}$, i.e. an internally generated supply voltage which is generated by a internal voltage generating circuit 40 as described hereinabove referring to FIG. 3, and which is greater than $V_{ss}$ (i.e. which is negative with respect to ground potential $V_{ss}$).

Figure 8:
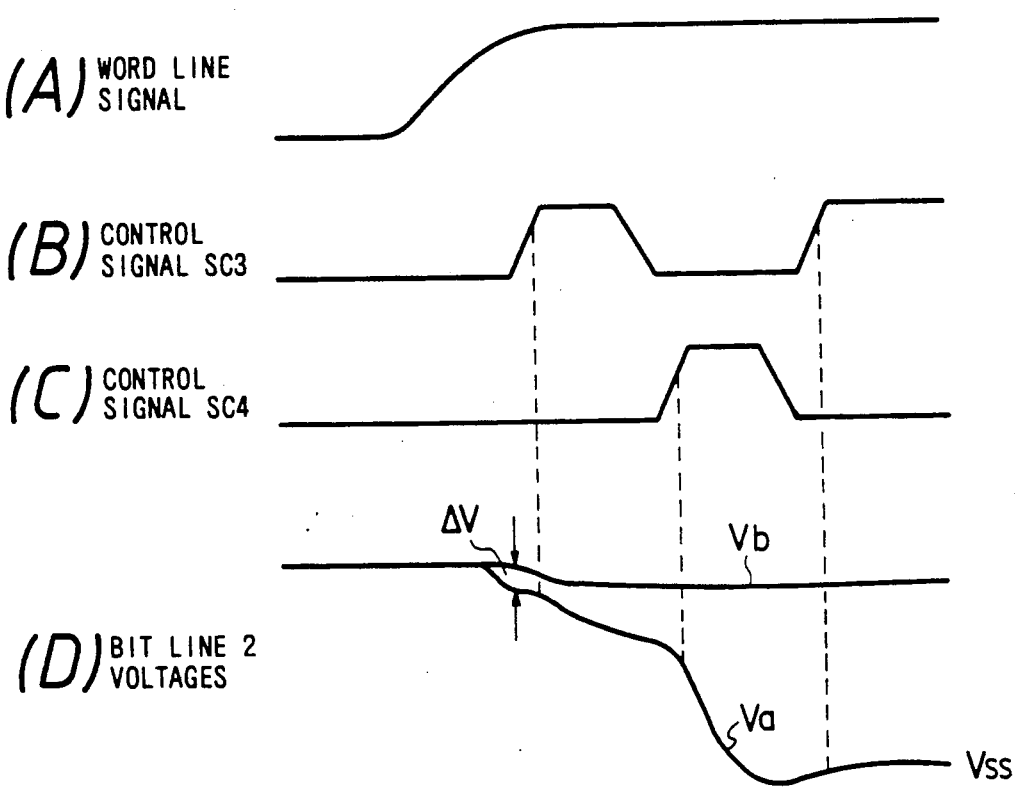
FIG. 8 is a waveform diagram for describing the operation of the circuit of FIG. 7.

The operation of the embodiment will be described referring to the waveform diagrams of FIG. 8. When a word line 7 is selected, by raising the potential thereof from a low to a high level as shown in waveform (A), then the switching control signal $SC_3$ is set from the low to the high potential level, as shown by waveform (B). The switching transistor 70 is thereby set in the ON state, to thereby activate the N-type flip-flop 10. If an output voltage is produced from a memory cell of the bit line pair 2 as a result of the word line selection voltage, then the respective potentials Va, Vb of the bit line pair 2 will begin to mutually differ, to produce a differential voltage $\Delta V$. As a result, the N-type flip-flop 10 is triggered, to thereby amplify the value of differential voltage V (i.e. current will flow from the bit line on which a read voltage has been produced, into one of the transistors of the N-type flip-flop 10, thereby driving that bit line voltage in the negative-going direction). In this condition, the relatively low value of supply voltage $V_{ss}$ is being applied through the switching transistor 70 to the common node of the N-type flip-flop 10. After a fixed interval has elapsed, the switching control signal $SC_3$ is returned to the low level, thereby setting the switching transistor 70 in the non-conducting state, and at the same time the switching control signal $SC_4$ is set form the low to the high potential level, to thereby turn ON the switching transistor 30, and thereby apply the high (i.e. more negative than ground potential) value of drive voltage $V_{bb}$ to the common node of the N-type flip-flop 10. In this condition, a high level of current is supplied through the switching transistor 30 and the N-type flip-flop 10 to the bit line on which a read voltage was produced. As a result, there is a rapid amplification of the differential voltage $\Delta V$, as shown in waveform (D). After a short time interval has elapsed, determined such that the voltage of a bit line will not become more negative than $V_{ss}$ (i.e. ground potential), the switching control signal $SC_4$ is returned from the high to the low level, and the switching control signal $SC_3$ is set from the low to the high level. In this condition, the low level of drive voltage $V_{ss}$ is applied via the switching transistor 30 to the common node of the N-type flip-flop 10.

It can thus be understood that this embodiment provides identical advantages to the first embodiment described above. Since the substrate potential of each transistor is fixed at the $V_{bb}$ value, which is more negative than $V_{ss}$, a source-drain forward bias condition is prevented from occurring.

Figure 9:
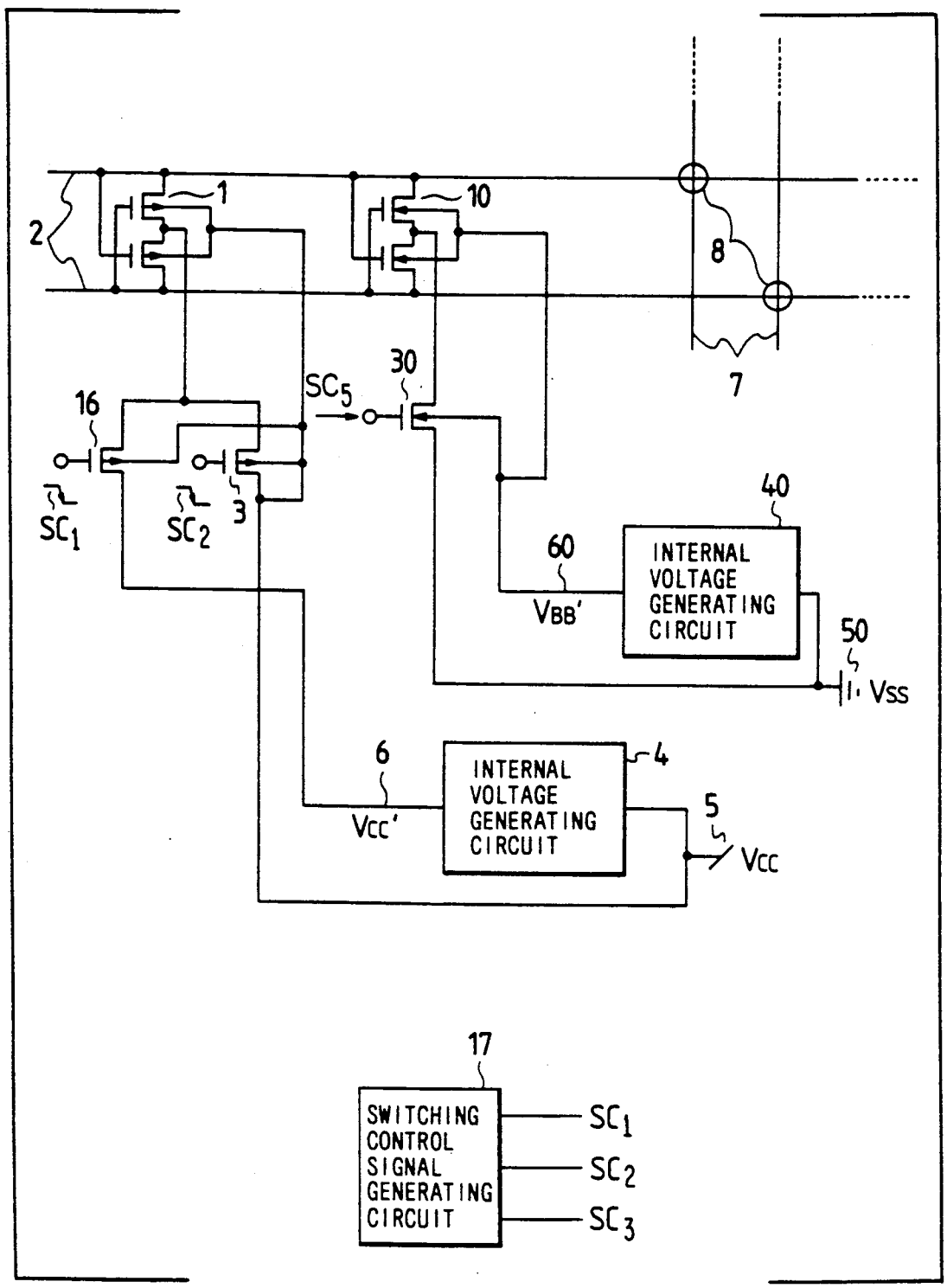
FIG. 9 is a circuit diagram of a third embodiment of a sense amplifier according to the present invention, which is a first embodiment of a CMOS type of sense amplifier.
Figure 10:
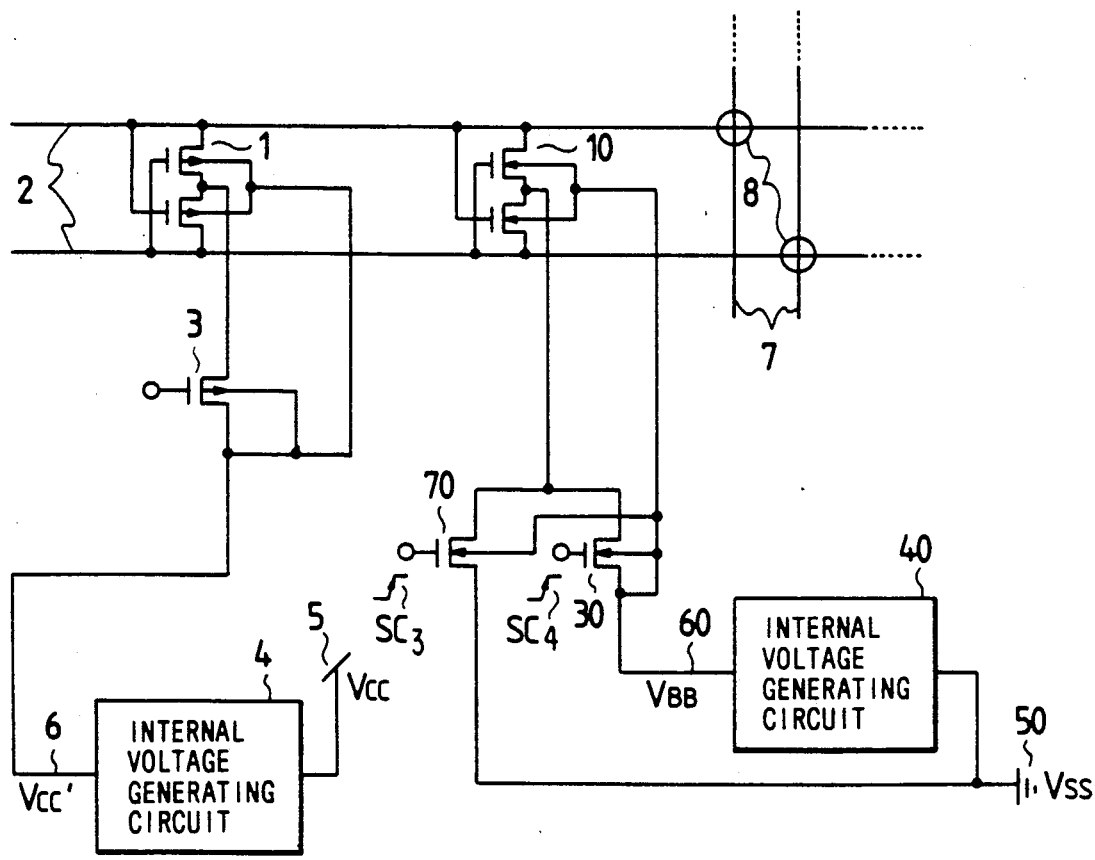
FIGS. 10 and 11 are respective circuit diagrams of fourth and fifth embodiments of a sense amplifier according to the present invention, each of which is a CMOS sense amplifier.
Figure 11:
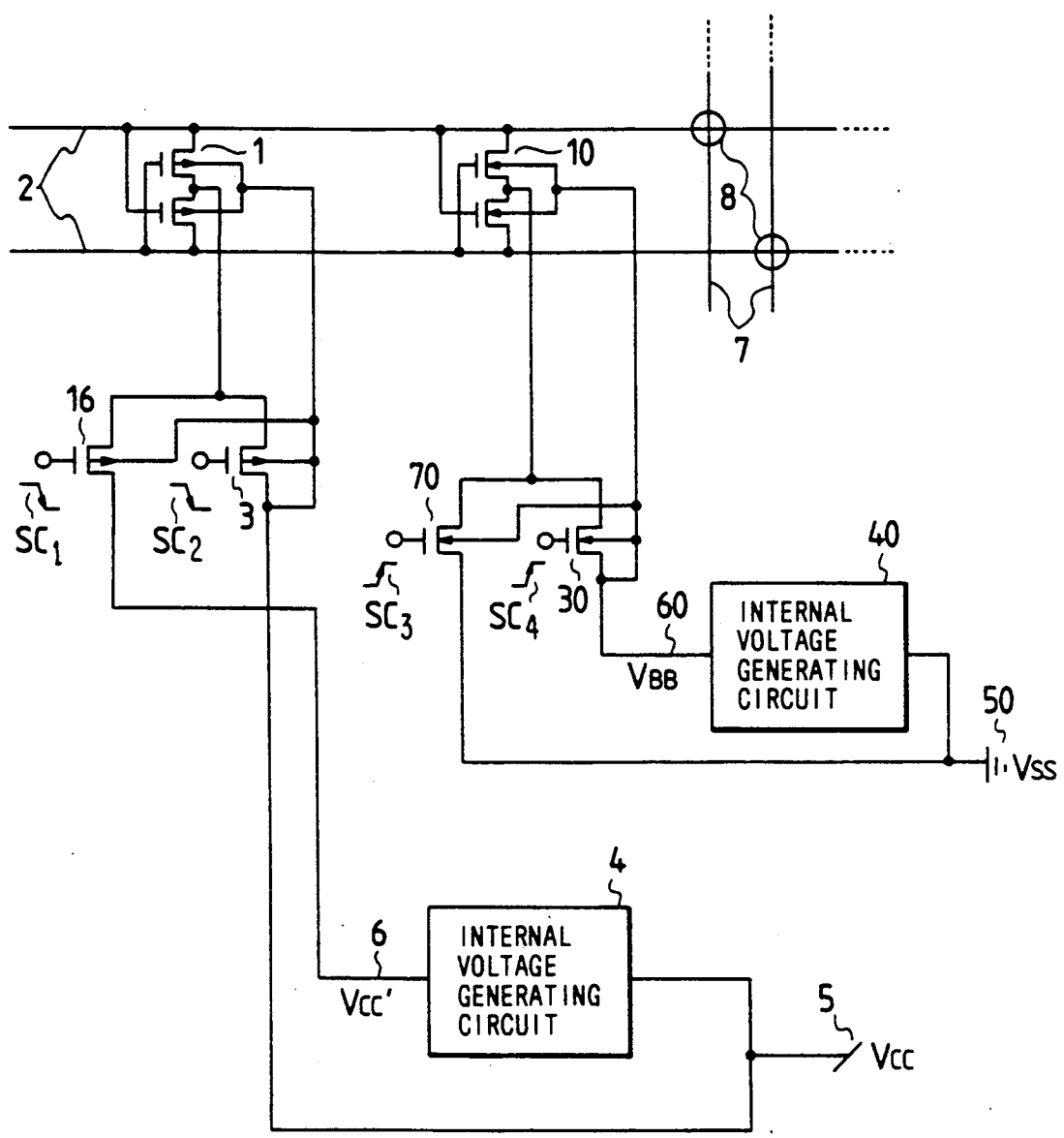

It will be apparent that the first and second embodiments of the present invention described above can be readily utilized in forming a CMOS sense amplifier. FIG. 9 shows a circuit diagram of a third embodiment of the present invention, which is a first example of a CMOS sense amplifier. FIGS. 10 and 11 show fourth and fifth embodiments of the present invention, which are second and third examples of a CMOS sense amplifier utilizing the principles of the invention. The third and fourth embodiments are combinations of the above embodiments of the invention with the previously described prior art. The fifth embodiment is a combination of the first and second embodiments of the invention.

Figure 3:
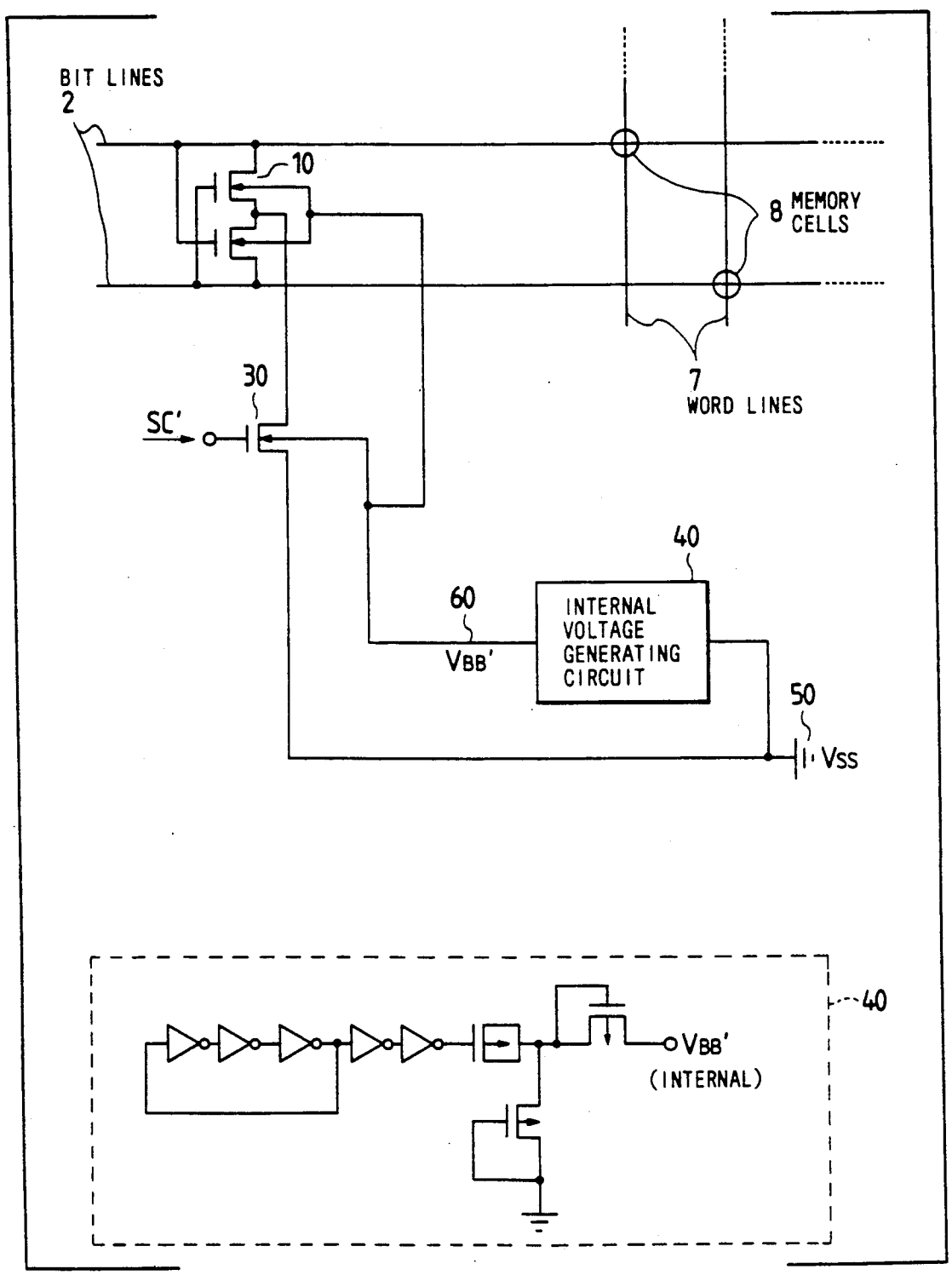
FIG. 3 is a circuit diagram of an example of a sense amplifier formed of N-channel MOS transistor.
Figure 4:
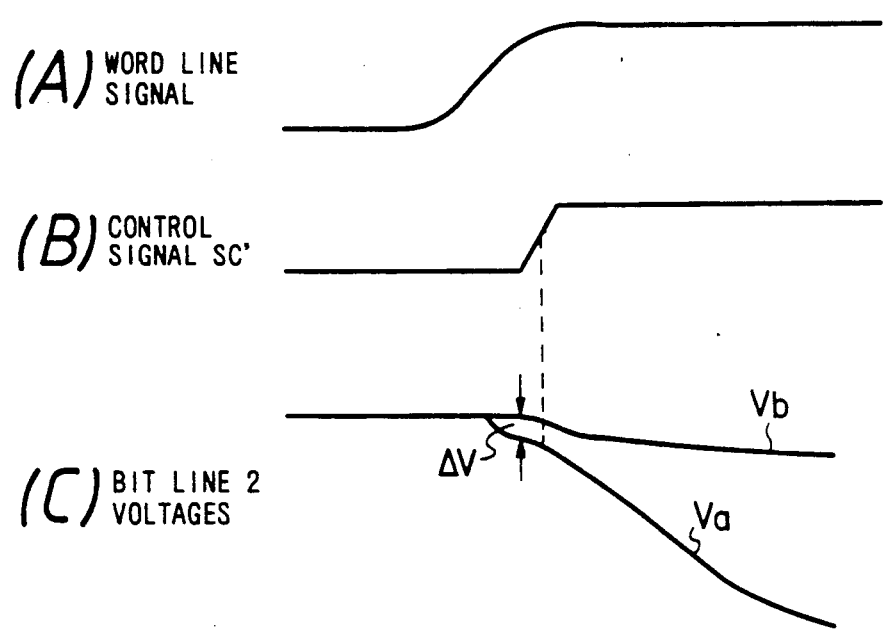
FIG. 4 is a waveform diagram for describing the operation of the circuit of FIG. 3.
Figure 12:
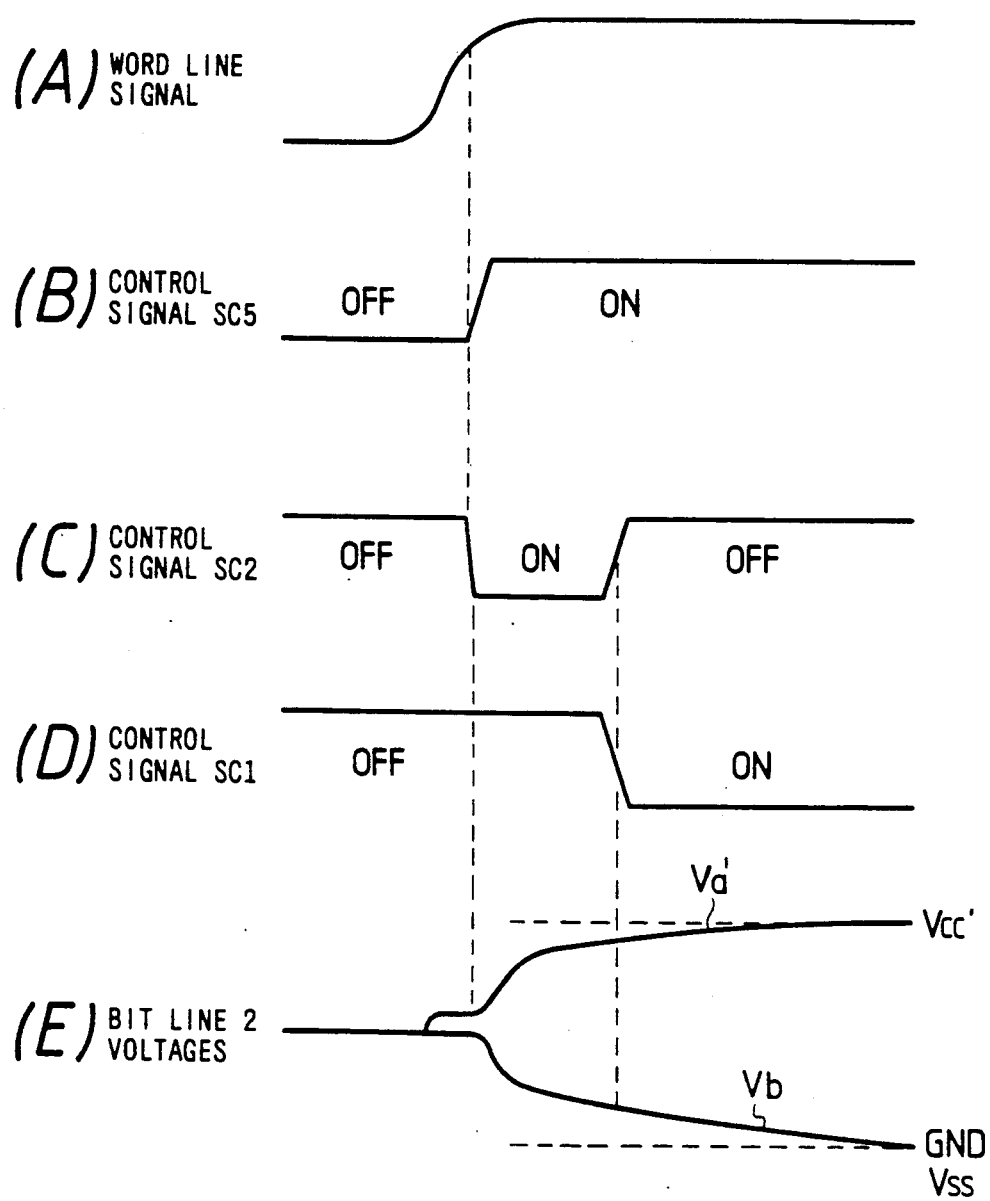
FIG. 12 is a waveform diagram for describing the operation of the circuit of FIG. 9.

The operation of the embodiment of FIG. 9, which is a combination of the embodiment of FIG. 5 with the prior art example of FIG. 3, will be described referring to the waveform diagram of FIG. 12, which waveform (A) shows the selection signal applied to a word line 7, (B) shows the switching control signal $SC_5$ that is applied to the switching transistor 30, (C) shows the switching control signal $SC_2$ that is applied to the switching transistor 3, waveform (D) shows the switching control signal $SC_1$ that is applied to the switching transistor 16, and (D) shows the waveform of a differential voltage that is produced as a result of a read voltage being produced on the bit line pair 2 as a result of the word line selection signal.

The operation is as follows. Normally, the potential of each bit line is at a value which is between the $V_{cc}$ and $V_{ss}$ levels. When the word line selection signal is raised from the low to the high level, then shortly after that transition begins, the switching control signal $SC_5$ applied to the switching transistor 30 is set from the low to the high level to thereby set the switching transistor 30 in the conducting state, while at the same time the switching control signal $SC_2$ applied to the switching transistor 3 is set from the high to the low level to thereby set that transistor in the conducting state. The P-type flip-flop 1 and the N-type flip-flop 10 are thereby activated simultaneously. If a read voltage is generated on one of the bit line pair 2 due to the word line selection signal transition, then this will begin to be amplified by the P-type flip-flop 1. At this time, the relatively high level of drive voltage $V_{cc}$ is being supplied by the switching transistor 3 to the common node of the P-type flip-flop 1, so that a high level of current is thereby initially supplied to by the switching transistor 3 to one of the bit line pair 2, thereby producing a rapid (positive-going) increase in the potential of that bit line, which is indicated as Va in FIG. 12(E), while in addition the N-type flip-flop 10 is also triggered, thereby resulting in a current flow which drives the other one of the bit line pair in the negative direction, as indicated by Vb in FIG. 12(E), so that the voltage of that bit line falls towards ground potential. In this way, the read voltage is rapidly amplified as a differential voltage $\Delta V$ of the bit line pair 2. After a fixed interval has elapsed which is determined such as to prevent the bit line potential from reaching the $V_{cc}$ level, the switching control signal $SC_2$ applied to the switching transistor 3 is returned to the high level, and the switching control signal $SC_1$ applied to the switching transistor 16 is set from the high to the low level, so that the switching transistor 16 is ON and the switching transistor 3 is OFF. The lower value of drive voltage $V_{cc}'$ is now applied through the switching transistor 16 to the common node of the P-type flip-flop 1, so that the corresponding bit line voltage will thereafter gradually rise to the $V_{cc}'$ level, as shown in FIG. 12(E).

In this way, such a CMOS sense amplifier can provide a very high rate of amplification of a bit line read voltage, with a simple circuit configuration.

In the above embodiment, when the P-type flip-flop 1 is activated, a high drive voltage is first applied to the common node for a fixed time interval, and thereafter the lower-level drive voltage is applied to the common node. If the transistor 3 is designed such as to have appropriate operating characteristics (e.g. which are optimized for providing an initial high surge of current) then this method may provide improved operation by comparison with the drive method used for the first and second embodiments, in which first the lower-level drive voltage, then the higher-level drive voltage, then finally the lower-level drive voltage are successively applied to the common node of a sense amplifier flip-flop.

The operation of the circuit of FIG. 10 can be essentially identical to that of the embodiment of FIG. 9, but with the N-type flip-flop 10 being successively driven by first a high supply voltage, then a low supply voltage, applied through the switching transistors 30 and 70 respectively to the common node of the flip-flop 10, so that further description will be omitted.

Figure 13:
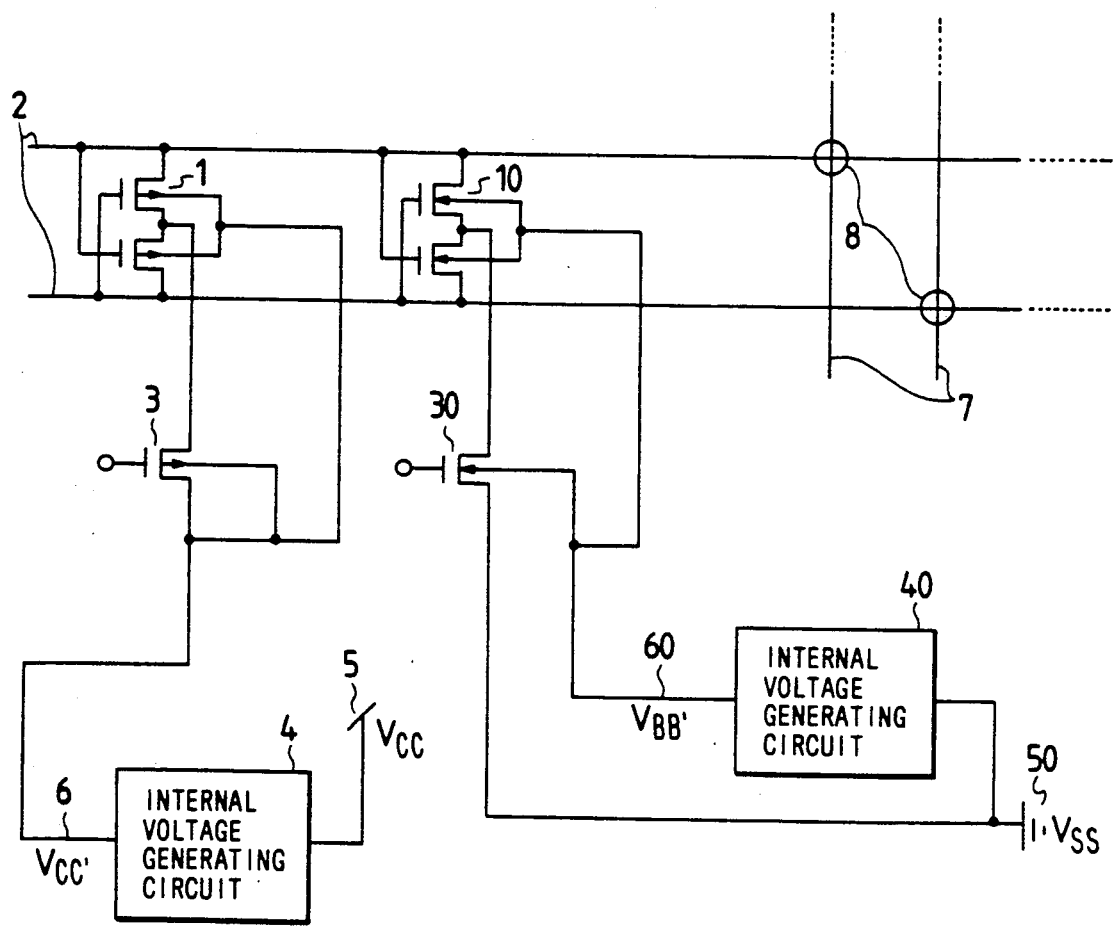
FIG. 13 is a circuit diagram of a prior art CMOS sense amplifier.
Figure 14:
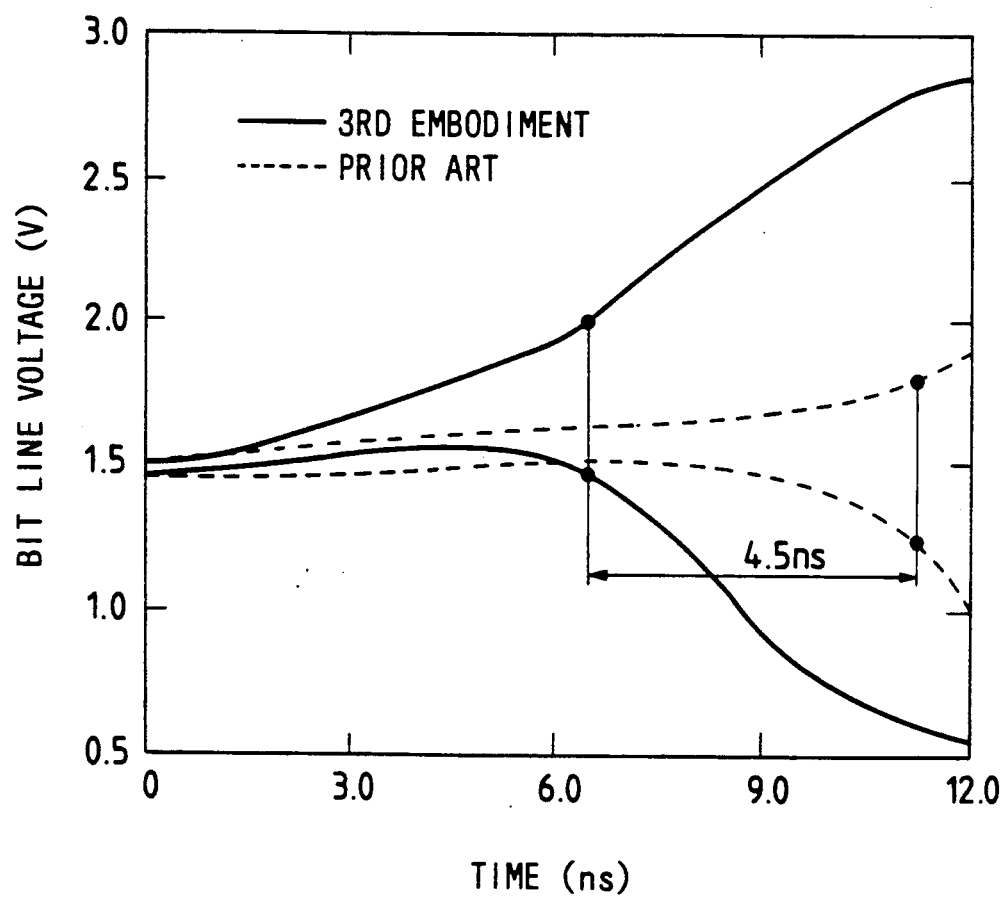
FIG. 14 is a waveform diagram for comparing results obtained with the third embodiment of the invention of FIG. 9 and the prior art example of FIG. 13.

FIG. 13 is a circuit diagram of a prior art type of CMOS sense amplifier, and FIG. 14 is a graph obtained by computer simulation, for comparing the results obtainable with the embodiment of FIG. 9 described above and the prior art sense amplifier of FIG. 13. The measurement conditions for FIG. 14 were a value of $V_{cc}$ (external supply voltage) of +4.5 V, and +3.0 V for the internal supply voltage $V_{cc}'$. Taking as a basis for comparison the time that is required for a bit line differential voltage of 0.5 V to be attained after word line selection begins, it can be seen that the sense amplifier of the present invention provides a reduction in delay time of approximately 4.5 nS.

It can thus be understood that the present invention enables a sense amplifier to be provided whereby a high speed of operation is achieved, yet whereby the maximum voltage that appears on any bit line of a semiconductor memory can be limited to a value which ensures that high reliability of the memory cell oxide film of the semiconductor memory.

It can moreover be understood that the basis of the invention lies in that a drive voltage having a relatively high absolute magnitude (i.e. as measured with respect to the steady-state potential of the bit lines prior to a memory read operation) is applied to a common node of the sense amplifier during a fixed time interval shortly after a memory read operation has been initiated, to thereby supply a high level of current for charging the bit line capacitance, but that the duration of application of that relatively high drive voltage is limited such as to prevent the voltage of any bit line from significantly increasing beyond a specific limit, to thereby ensure reliability of the memory cell oxide film, and that a lower level of drive voltage is thereafter applied to the common node.

It will be apparent that various modifications to the above embodiments can be envisaged, e.g. such as applying successively different values of drive voltage to the common node of a sensing flip-flop in more than two successive intervals, but that such modifications are within the scope of the invention as set out in the appended claims.

Figure 15:
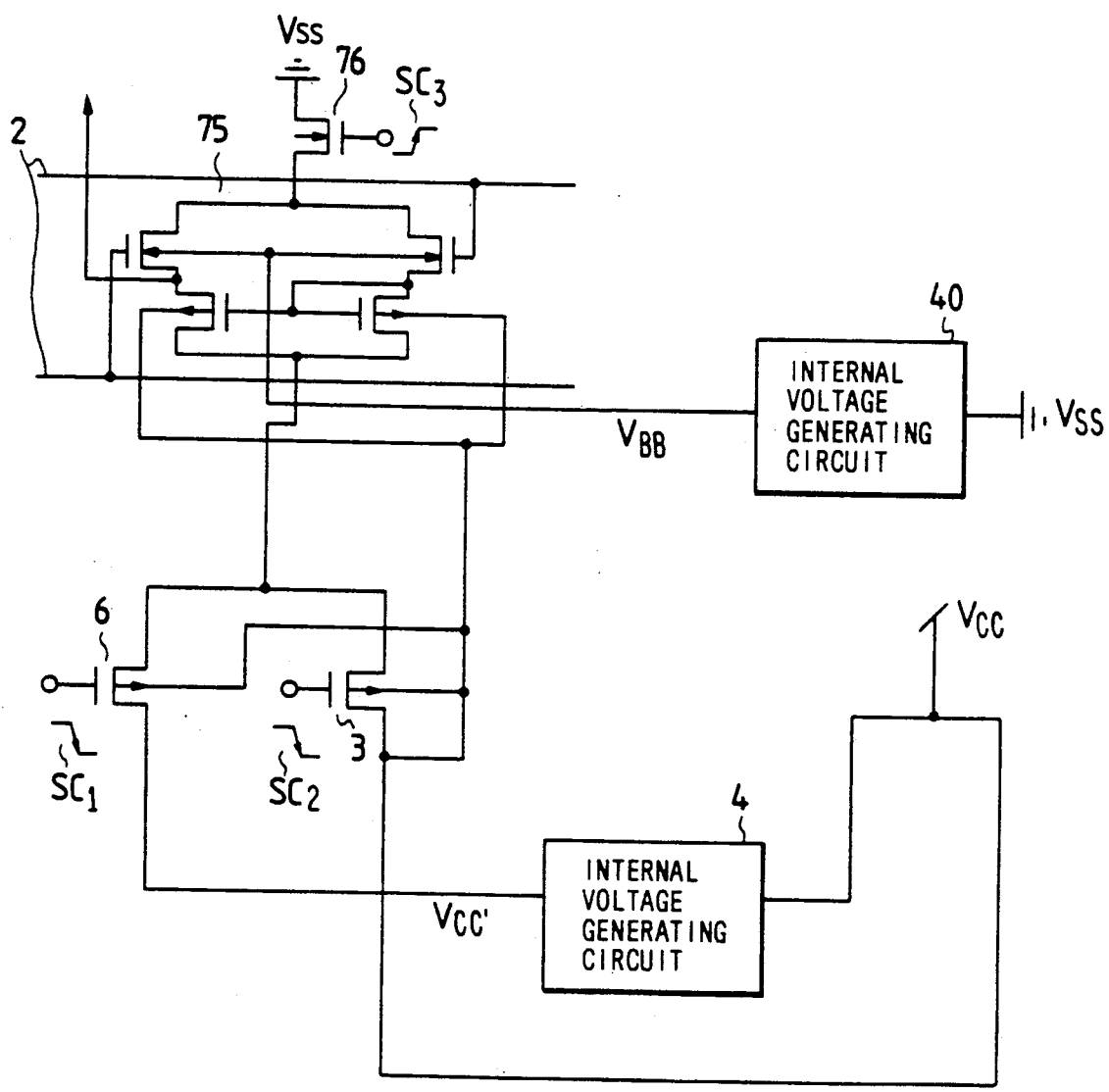
FIG. 15 is a circuit diagram of an embodiment of the invention based on a current mirror circuit for amplifying a bit line pair voltage.

It should also be noted that although the invention has been described in the above for the case of a flip-flop type of sense amplifier being used, the invention is equally applicable to a sense amplifier which is of current mirror configuration. FIG. 15 shows an embodiment of the invention in which a current mirror circuit 75 formed of two N-channel MOS transistors and two P-channel MOS transistors is utilized in place of the flip-flop 1 of the embodiment of FIG. 5. A switching control signal SC₃ of a switching transistor 76 goes from the low to the high level when a word line selection signal goes to the high level. Apart from that, the operation of the embodiment is similar to that of the embodiment of FIG. 5, with the switching transistors 30 and 70 being coupled to a common node of a pair of transistors of the current mirror circuit which have gate electrodes thereof respectively connected to the pair of bit lines 2, so that further description will be omitted.

Figure 16:
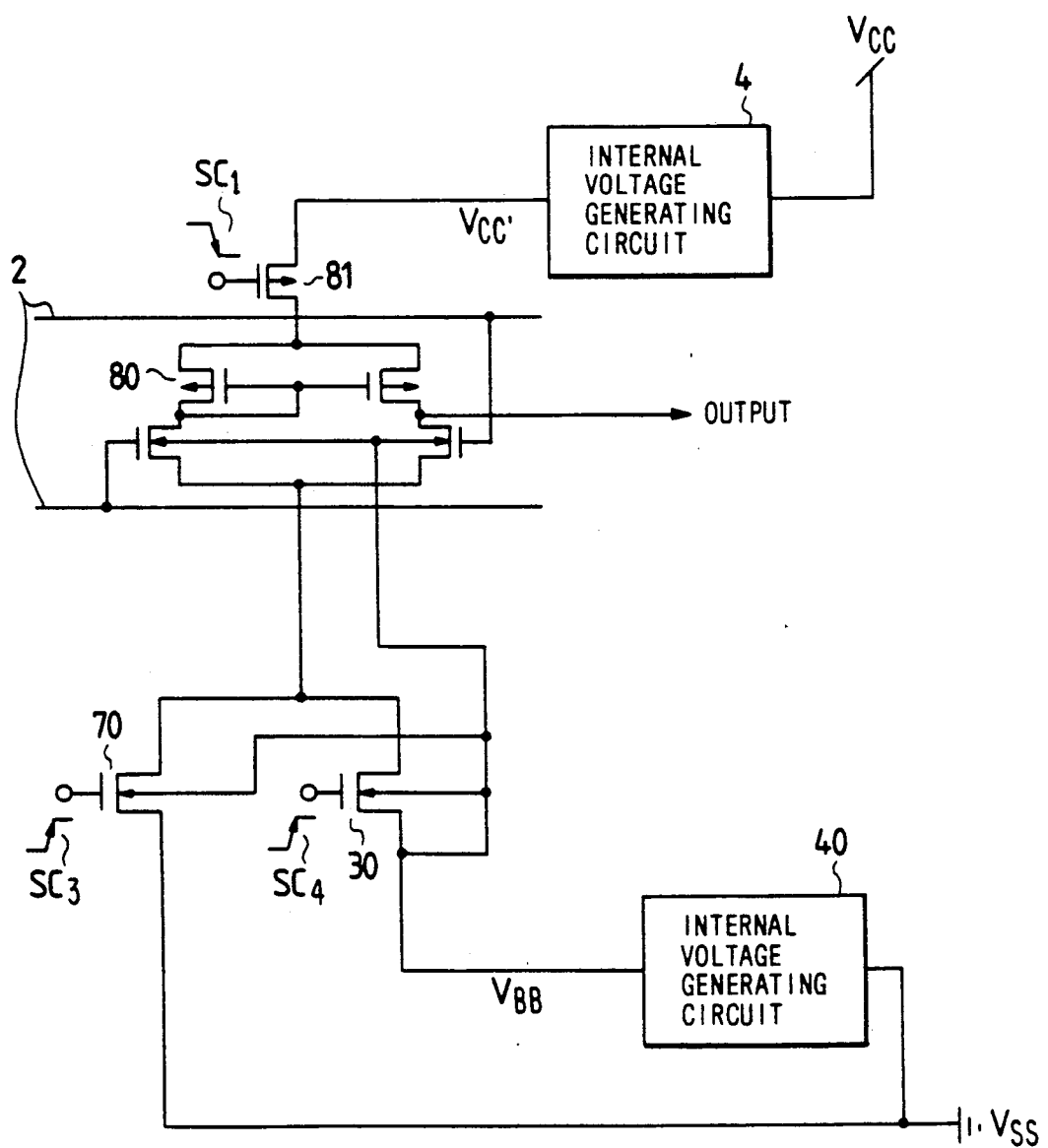
FIG. 16 is a circuit diagram of another embodiment of a sense amplifier based on a current mirror circuit.

FIG. 16 shows another embodiment of a current mirror type of sense amplifier according to the present invention, whose operation is similar to that of the embodiment of FIG. 7 described above, and in which a current mirror circuit is formed by two N-channel MOS transistors and two P-channel MOS transistors. A switching control signal SC₁ of a switching transistor 81 goes from the high to the low level when a word line selection signal goes to the high level. With this embodiment, as for the embodiment of FIG. 15, the amplified sense output signal is generated as a voltage which varies with respect to ground potential, rather than as a differential voltage as in the case of the preceding embodiments. Otherwise, the operation will be readily understood from the description of the embodiment of FIG. 7, so that further description will be omitted.

What is claimed is:

1. In a semiconductor memory, the sense amplifier including a pair of transistors respectively coupled to a pair of bit lines for amplifying a differential voltage appearing between the bit lines, the transistors being mutually coupled at a common node, the improvement comprising:

at least a first switching element coupled between a first DC supply voltage and the common node, and a second switching element coupled between a second DC supply voltage and the common node, the first DC supply voltage having a greater absolute magnitude than the second DC supply voltage; and means for generating first and second switching control signals for respectively controlling the first and second switching elements subsequent to initiation of a read operation of the semiconductor memory, to successively apply the first and second DC supply voltages to the common node.

2. A sense amplifier according to claim 1, in which following the read operation initiation, the first DC supply voltage is applied to the common node during a fixed time interval, and in which the second DC supply voltage is thereafter applied to the common node.

3. A sense amplifier according to claim 2, in which the fixed time interval has a duration determined such as to prevent a voltage of either of the bit lines from exceeding the second DC supply voltage.

4. A sense amplifier according to claim 1, in which following the read operation initiation, the second DC supply voltage is applied to the common node during a first fixed time interval, the first DC supply voltage is then applied to the common node during a second fixed time interval, and the second DC supply voltage is thereafter applied to the common node.

5. A sense amplifier according to claim 4, in which the second fixed time interval has a duration determined such as to prevent a voltage of either of the bit lines from exceeding the second DC supply voltage.

6. A sense amplifier according to claim 1 in which the pair of transistors are connected in a flip-flop circuit.

7. A sense amplifier according to claim 1 in which the pair of transistors are connected in a current mirror circuit.

8. A sense amplifier according to claim 1 in which each of the pair of transistors and the switching elements comprises a P-type MOS field effect transistor.

9. A sense amplifier according to claim 1 in which each of the pair of transistors and the switching elements comprises an N-type MOS field effect transistor.

* * * * *